US011407061B2

(12) United States Patent
Lee et al.

(10) Patent No.: US 11,407,061 B2
(45) Date of Patent: Aug. 9, 2022

(54) LASER CRYSTALLIZING APPARATUS AND METHOD OF MANUFACTURING DISPLAY APPARATUS

(71) Applicant: Samsung Display Co., Ltd., Yongin-Si (KR)

(72) Inventors: Dong-Sung Lee, Hwaseong-si (KR); Dong-min Lee, Yongin-si (KR); Jongoh Seo, Seoul (KR); Byung Soo So, Yongin-si (KR)

(73) Assignee: Samsung Display Co., Ltd.

( * ) Notice: Subject to any disclaimer, the term of this patent is extended or adjusted under 35 U.S.C. 154(b) by 208 days.

(21) Appl. No.: 16/698,842

(22) Filed: Nov. 27, 2019

(65) Prior Publication Data

US 2020/0171600 A1 Jun. 4, 2020

(30) Foreign Application Priority Data

Dec. 3, 2018 (KR) ........................ 10-2018-0153772

(51) Int. Cl.

*B23K 26/04* (2014.01)
*B23K 26/0622* (2014.01)
*H01L 21/02* (2006.01)
*H01L 21/20* (2006.01)
*B23K 101/40* (2006.01)

(52) U.S. Cl.

CPC ........ *B23K 26/043* (2013.01); *B23K 26/0622* (2015.10); *H01L 21/02068* (2013.01); *H01L 21/2026* (2013.01); *B23K 2101/40* (2018.08)

(58) Field of Classification Search

CPC .............. B23K 26/043; B23K 26/0622; B23K 2101/40; B23K 2103/56; B23K 26/0006; B23K 26/0648; B23K 26/0738; B23K 26/352; H01L 21/02068; H01L 21/2026; H01L 21/02678; H01L 21/02686; H01L 21/02691; H01L 21/02532; H01L 21/02675; H01L 21/0262; H01L 21/67011; H01L 21/02118; H01L 21/02271; G02B 27/18

See application file for complete search history.

(56) References Cited

U.S. PATENT DOCUMENTS

2003/0089691 A1* 5/2003 Tanaka ............... B23K 26/0732 219/121.67
2006/0019473 A1* 1/2006 Choi ................. H01L 21/02672 438/486
2011/0086441 A1* 4/2011 Kawaguchi ............ G02B 27/48 438/7

(Continued)

FOREIGN PATENT DOCUMENTS

JP 2002-064060 A 2/2002
JP 2005-175476 A 6/2005

(Continued)

*Primary Examiner* — John P. Dulka
(74) *Attorney, Agent, or Firm* — Innovation Counsel LLP

(57) ABSTRACT

A laser crystallizing apparatus may include a laser light source, an optical system, and an optical module. The laser light source may generate a laser beam. The optical system may convert the laser beam into a line laser beam. The optical module may disperse energy of the line laser beam in a first direction for generating a dispersed line laser beam. The first direction may be perpendicular to a lengthwise direction of the optical module.

18 Claims, 8 Drawing Sheets

(56) References Cited

U.S. PATENT DOCUMENTS

2011/0117685 A1* 5/2011 Kim .................. H01L 29/66757
438/23
2019/0304782 A1* 10/2019 Gao ..................... B23K 26/083

FOREIGN PATENT DOCUMENTS

KR 10-0284709 B1 4/2001
KR 10-0338146 B1 8/2002
KR 10-1886862 B1 8/2018

* cited by examiner

LS
HZ
LP
PLN
OP
EP
ENERGY
X

ENERGY
X
(a) COMPARATIVE EXAMPLE
(b) EMBODIMENT

LASER CRYSTALLIZING APPARATUS AND METHOD OF MANUFACTURING DISPLAY APPARATUS

This application claims priority to Korean Patent Application No. 10-2018-0153772, filed on Dec. 3, 2018; the Korean Patent application is incorporated herein by reference.

BACKGROUND

1. Field

The technical field relates to a laser crystallizing apparatus and a method of manufacturing a display apparatus using the laser crystallizing apparatus.

2. Description of the Related Art

A display apparatus may include a transistor for controlling light emission or light transmission of display elements. The transistor may include a poly-silicon member as a semiconductor member. Characteristics of the poly-silicon member may affect the performance of the transistor and therefore may affect the performance of the display apparatus.

SUMMARY

One or more embodiments may be related to a laser crystallizing apparatus configured to form a poly-silicon layer having excellent quality. The poly-silicon layer may be used in a display apparatus.

One or more embodiments may be related to a method of manufacturing a display apparatus using the laser crystallizing apparatus.

According to an embodiment, a laser crystallizing apparatus includes a laser light source configured to generate a laser beam, an optical system for converting the laser beam into a line laser beam having a short side in a first direction and a long side in a second direction perpendicular to the first direction, an optical module to which the line laser beam is irradiated, and disposed between a substrate, which is disposed on a plane formed by the first and second directions, and the optical system, wherein the optical module disperses energy of the line laser beam in the first direction configured to increase a length of an energy profile of the line laser beam in the first direction and lowering a peak value of the energy profile.

In an embodiment, the optical module may be a lens having an upper surface has a plane inclined with respect to the plane.

In an embodiment, an angle between the upper surface of the lens and the plane may be 5 degrees to 45 degrees.

In an embodiment, the optical module may be a lens having an upper surface which is a curved surface inclined with respect to the plane.

In an embodiment, front 20% of the laser beam irradiated on the substrate in the first may have an energy of 150 (mJ/cm^2) or less.

In an embodiment, the substrate may be moved in the first direction, and the laser beam may be irradiated to the substrate a plurality of times.

In an embodiment, the laser crystallizing apparatus may further include a homogenizer for making a distribution of the energy of the laser beam uniform to which the laser beam from the laser light source is incident; and a P-lens for emitting the line laser beam to which the laser beam passed through the homogenizer is incident.

In an embodiment, the substrate may include a base substrate and an amorphous silicon layer formed on the base substrate. The amorphous silicon layer may be crystallized as the laser beam is irradiated onto the substrate to form a poly-silicon layer.

In an embodiment, the amorphous silicon layer may have a hydrogen concentration of 2 at % (atomic percent) or more.

In an embodiment, the poly-silicon layer may have a hydrogen concentration of 2 at % or less.

According to an embodiment, a method of manufacturing a display apparatus includes forming an amorphous silicon layer on a base substrate, forming a poly-silicon layer by irradiating and crystallizing the amorphous silicon layer with the laser beam, forming an active pattern by patterning the poly-silicon layer; and forming an insulating layer on the active pattern. The laser beam is a line laser beam, and front 20% of the line laser beam in a short side has an energy of 150 (mJ/cm^2) or less.

In an embodiment, forming the poly-silicon layer may be performed by a laser crystallizing apparatus. The laser crystallizing apparatus may include a laser light source configured to generate a laser beam, an optical system for converting the laser beam into a line laser beam having a short side in a first direction and a long side in a second direction perpendicular to the first direction, an optical module to which the line laser beam is irradiated, and disposed between a substrate, which is disposed on a plane formed by the first and second directions, and the optical system, wherein the optical module disperses energy of the line laser beam in the first direction configured to increase a length of an energy profile of the line laser beam in the first direction and lowering a peak value of the energy profile.

In an embodiment, the amorphous silicon layer may be formed through a chemical vapor deposition process.

In an embodiment, a heat treatment process may not proceed between forming the amorphous silicon layer and forming the poly-silicon layer.

In an embodiment, the hydrogen concentration in the amorphous silicon layer immediately before forming the poly-silicon layer may be 2 at % or more.

In an embodiment, the hydrogen concentration in the poly-silicon layer immediately after forming the poly-silicon layer may not more than 2 at %.

In an embodiment, the base substrate may include a transparent polyimide layer.

In an embodiment, each process in the method may be performed below 350 Celsius degrees.

In an embodiment, the method may further include forming source and drain electrodes on the insulating layer, forming a first electrode on the source and drain electrodes, forming a light emitting layer on the first electrode, and forming a second electrode on the light emitting layer.

According to an embodiment, a laser crystallizing apparatus includes a laser light source configured to generate a laser beam, a lens for emitting a line laser beam having a short side in a first direction and a long side in a second direction perpendicular to the first direction, to which the laser beam is incident, and an optical module disposed between the lens and a substrate to which a laser is irradiated to change an energy profile of the line laser beam in the first direction.

An embodiment may be related to a laser crystallizing apparatus. The laser crystallizing apparatus may include a laser light source, an optical system, and an optical module.

The laser light source may generate a laser beam. The optical system may convert the laser beam into a line laser beam. The optical module may disperse energy of the line laser beam in a first direction for generating a dispersed line laser beam. The first direction may be perpendicular to a lengthwise direction of the optical module.

The optical module may include an input face for receiving the line laser beam and may include an output face for outputting the dispersed line laser beam. The input face may be inclined with respect to the output face.

An angle between the input face and the output face may be in a range of 5 degrees to 45 degrees.

The optical module may be a concave lens having a concave input surface for receiving the line laser beam.

Energy density of front 20% of the dispersed line laser beam in the first direction may be 150 mJ/cm^2 or less.

The laser crystallizing apparatus may include a mechanism for moving a substrate in the first direction relative to the optical module. A plurality of instances of the dispersed laser beam may be projected onto the substrate for a plurality of times.

The optical system may include the following elements: a homogenizer for redistributing energy of the laser beam to generate a redistributed laser beam; and a P-lens for converting the redistributed laser beam into the line laser beam.

The laser crystallizing apparatus may include a base substrate for supporting an amorphous silicon layer. The optical module may overlap the base substrate.

The optical module may project the dispersed line laser beam onto the amorphous silicon layer for changing the amorphous silicon layer into a poly-silicon layer. A hydrogen concentration of the amorphous silicon layer may be 2 at % or more.

A hydrogen concentration of the poly-silicon layer may be 2 at % or less.

An embodiment may be related to a method of manufacturing a display apparatus. The method may include the following steps: forming an amorphous silicon layer on a base substrate; moving the base substrate in a first direction after projecting a first instance of a dispersed line laser beam onto the amorphous silicon layer and before projecting a second instance of the dispersed line laser beam onto the amorphous silicon layer; forming a poly-silicon layer by projecting instances of the dispersed line laser beam onto the amorphous silicon layer for crystallizing the amorphous silicon layer; forming a semiconductor member by patterning the poly-silicon layer; and forming an insulating layer on the semiconductor member. Energy density of front 20% of the dispersed line laser beam in the first direction may be 150 mJ/cm^2 or less.

The method may include using a laser crystallizing apparatus to provide the dispersed line laser beam. The laser crystallizing apparatus may include the following elements: a laser light source configured to generate a laser beam; an optical system for converting the laser beam into a line laser beam; and an optical module configured to disperse energy of the line laser beam in the first direction for generating the line laser beam. The first direction may be perpendicular to a lengthwise direction of the optical module.

The amorphous silicon layer may be formed through a chemical vapor deposition process.

No heat treatment may be performed on the amorphous silicon layer before any instance of the dispersed line laser beam is projected onto the amorphous silicon layer.

Immediately before the dispersed line laser beam is projected onto the amorphous silicon layer, a hydrogen concentration in the amorphous silicon layer may be 2 at % or more.

A hydrogen concentration in the poly-silicon layer immediately after forming the poly-silicon layer may be 2 at % or less.

The base substrate may include a transparent polyimide layer.

Each process in the method may be performed below 350 Celsius degrees. No process in the method may be performed above 350 Celsius degrees.

The method may include the following steps: forming source and drain electrodes on the insulating layer; forming a first electrode on the source and drain electrodes; forming a light emitting layer on the first electrode; and forming a second electrode on the light emitting layer.

An embodiment may be related to a laser crystallizing apparatus. The laser crystallizing apparatus may include the following elements: a laser light source configured to generate a laser beam; a lens set for converting the laser beam into a line laser beam; and an optical module configured to change an energy profile of the line laser beam in a first direction. The first direction may be perpendicular to a lengthwise direction of the optical module.

According to embodiments, the laser crystallizing apparatus includes the optical module for changing/optimizing the energy profile of the laser beam. Therefore, a display apparatus including a poly-silicon layer having excellent quality can be manufactured without an additional high temperature heat treatment process for separate dehydrogenation.

DETAILED DESCRIPTION

Example embodiments are described with reference to the accompanying drawings. Although the terms "first," "second," etc. may be used to describe various elements, these elements, should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first-type (or first-set)," "second-type (or second-set)," etc., respectively. An element may mean/represent an element set; for example, a "lens" may mean a "lens set" or a set of lenses. The term "apparatus" may mean "device." The term "pattern" may mean "member" or "layer." The term "active pattern" may mean "semiconductor member."

Figure 1:
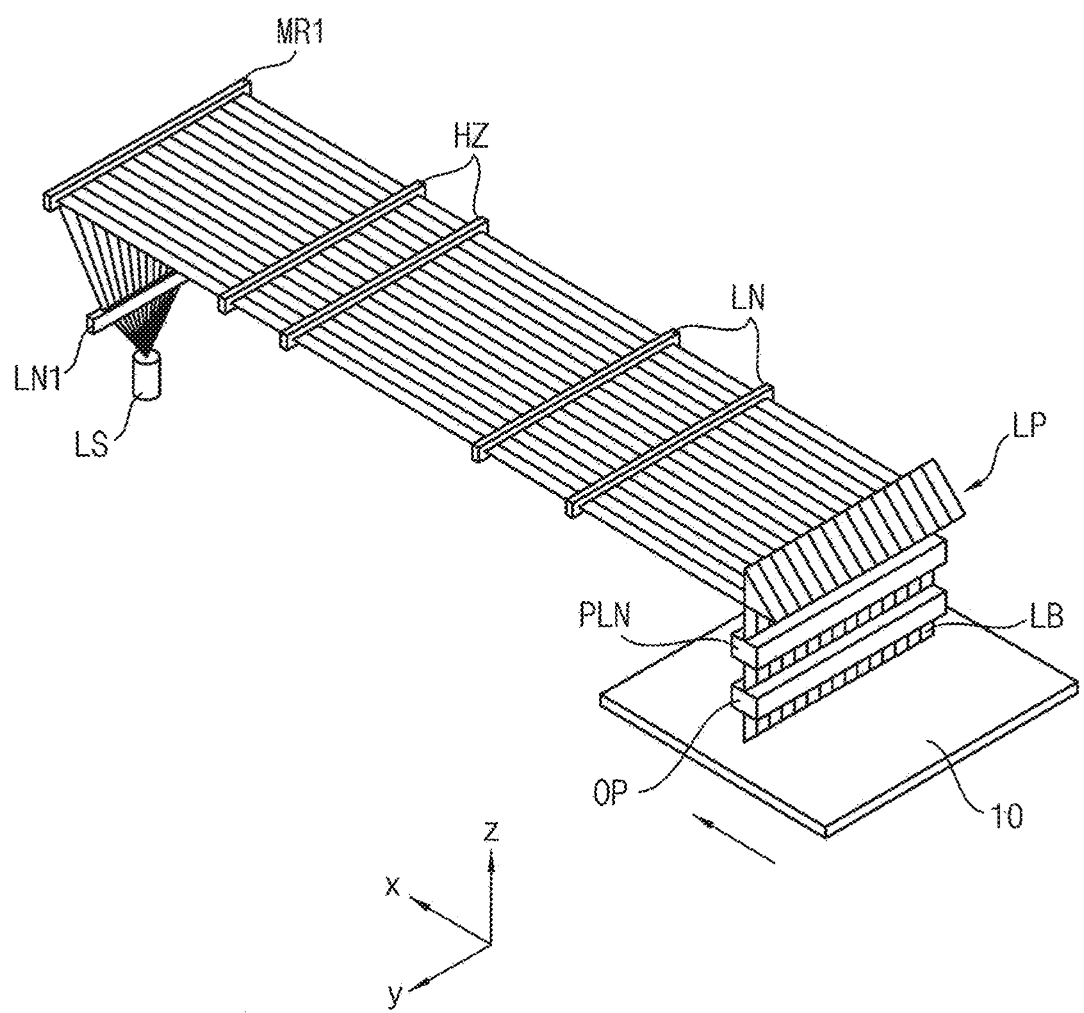
FIG. 1 is a perspective view illustrating a laser crystallizing apparatus that provides a laser beam according to an embodiment.
Figure 2:
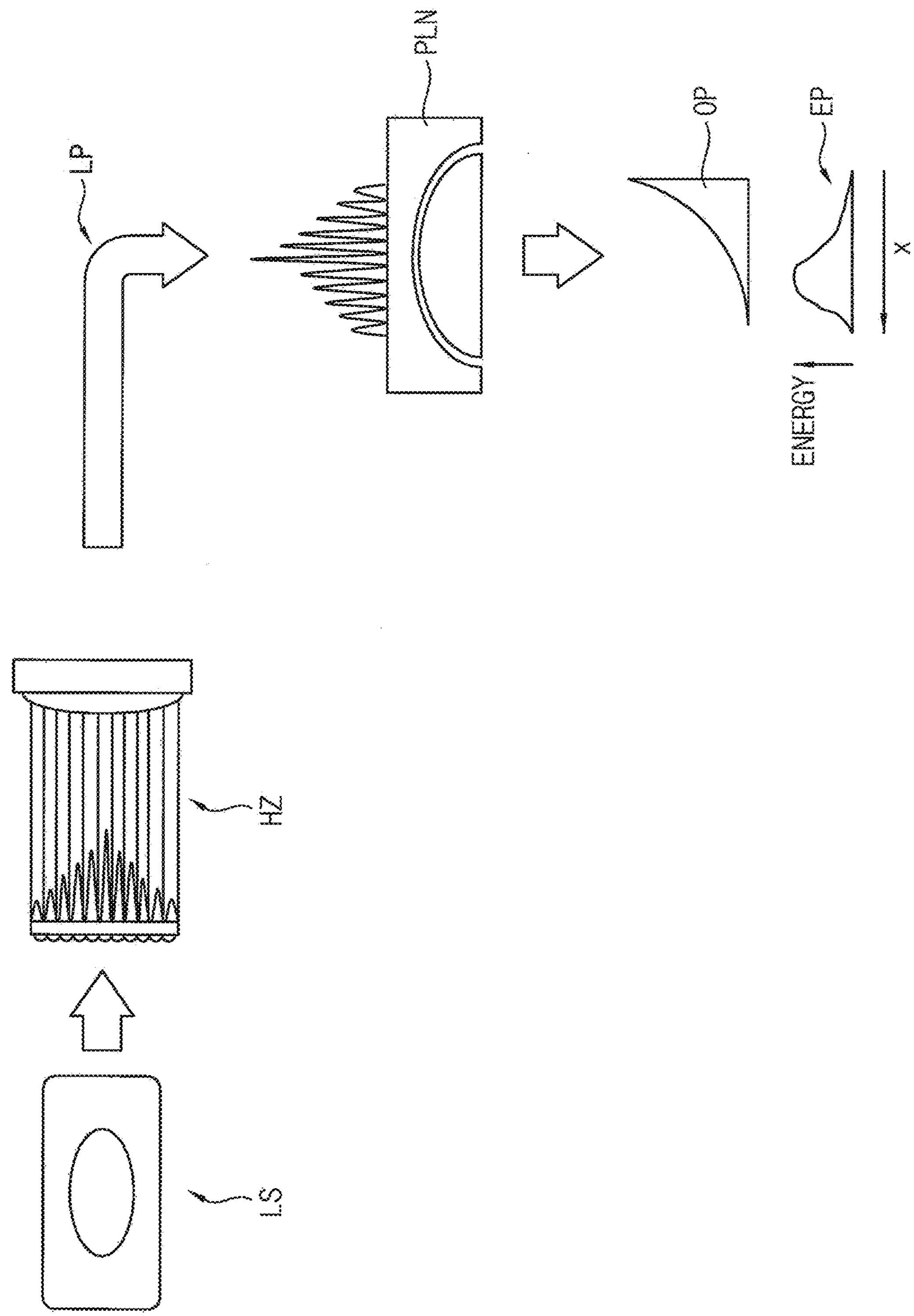
FIG. 2 is a view for explaining parts of a laser crystallizing apparatus and characteristics of a laser beam according to an embodiment.

FIG. 1 is a perspective view illustrating a laser crystallizing apparatus that provides a laser beam according to an embodiment. FIG. 2 is a view for explaining parts of the laser crystallizing apparatus and characteristics of the laser beam according to an embodiment.

Referring to FIGS. 1 and 2, the laser crystallizing apparatus includes a laser light source LS for generating a laser beam, an optical system for changing a path of the laser beam and converting the laser beam into a line laser beam, and an optical module disposed between the optical system and a substrate 10 to be processed.

The laser light source LS may generate a laser beam LB. The laser light source LS may be a laser oscillator. The laser beam LB may be formed using a laser generated by the laser oscillator, and the laser may be a gas laser or a solid laser. Examples of the gas laser may be an Ar laser, a Kr laser, and the like. Examples of the solid laser may be a YAG laser, a YVO4 laser, a YLF laser, a YAlO3 laser, a Y2O3 laser, a glass laser, a ruby laser, an alexandrite laser, a Ti:sapphire laser, and the like.

The optical system may include one or more lenses and/or one or more mirrors. For example, the optical system may include a first lens LN1, a first mirror MR1, a homogenizer HZ, a lens LN, a path converting part LP, and a P-lens PLN.

The first lens LN1 and the first mirror MR1 may convert the path and distribution of the laser beam LB and provide the converted laser beam LB to the homogenizer HZ. The configurations of the first lens LN1 and the first mirror MR1 may be variously changed according to embodiments.

The homogenizer HZ may receive a laser beam having an energy density of Gaussian distribution and convert the laser beam into a laser beam having a uniform energy density in one direction.

The lens LN may include an appropriate number of lenses arranged in appropriate positions in order to change the path of the laser beam LB and convert the laser beam LB into the line laser beam LB.

The path converting part LP may convert the path of the line laser beam LB so that the line laser beam LB can be irradiated onto the substrate 10. The path converting part LP may include at least one of various structures such as at least one of a prism, a mirror, and a lens.

The P-lens PLN may convert the line laser beam LB passing through the path converting part LP into a final form for irradiating on the substrate 10. The laser beam LB having passed through the P-lens PLN may be incident into the substrate 10 in a third direction (z) perpendicular to the first direction (x) and the second direction (y).

An incident angle of the laser beam LB on the substrate 10 may affect the crystallization of the amorphous silicon on the substrate 10. In an embodiment, the laser beam LB may be incident on the substrate 10 in a direction inclined at a predetermined angle with respect to the third direction (z).

The optical module OP may be disposed between the P-lens PLN and the substrate 10. The optical module OP may change the energy profile EP of the line laser beam LB in the first direction (x).

The optical module OP may disperse energy of the line laser beam in the first direction (x) for increasing a length of an energy profile EP of the line laser beam in the first direction (x) and for lowering a peak value of the energy profile EP. Compared with a line laser beam of a conventional laser crystallizing apparatus, in which the optical module OP is not included, the line laser beam of the laser crystallizing apparatus according to an embodiment has a lower peak value of the energy profile EP in the short side direction, and a slope value of front of the laser beam in the first direction may be lower.

The substrate 10 may include a base substrate and an amorphous silicon layer formed on the base substrate. The amorphous silicon layer may be crystallized by the laser beam LB to form a poly-silicon layer.

An Excimer Laser Annealing (ELA) process may be performed for crystallizing amorphous silicon (a-Si) into polycrystalline silicon (p-Si). In the ELA process, the a-Si may be heat treated by instantaneous high laser energy generated by high voltage discharge provided to the laser source. Many optical lenses may be used for improving the shape and uniformity of the laser beam provided by the laser crystallizing apparatus. The grain formation may be affected by incident angle and divergence of the laser beam, According to an embodiment, the optical module OP may optimize the level of the laser energy provided to the amorphous silicon layer of the substrate 10. Advantageously, an optimized poly-silicon layer can be obtained.

Figure 3:
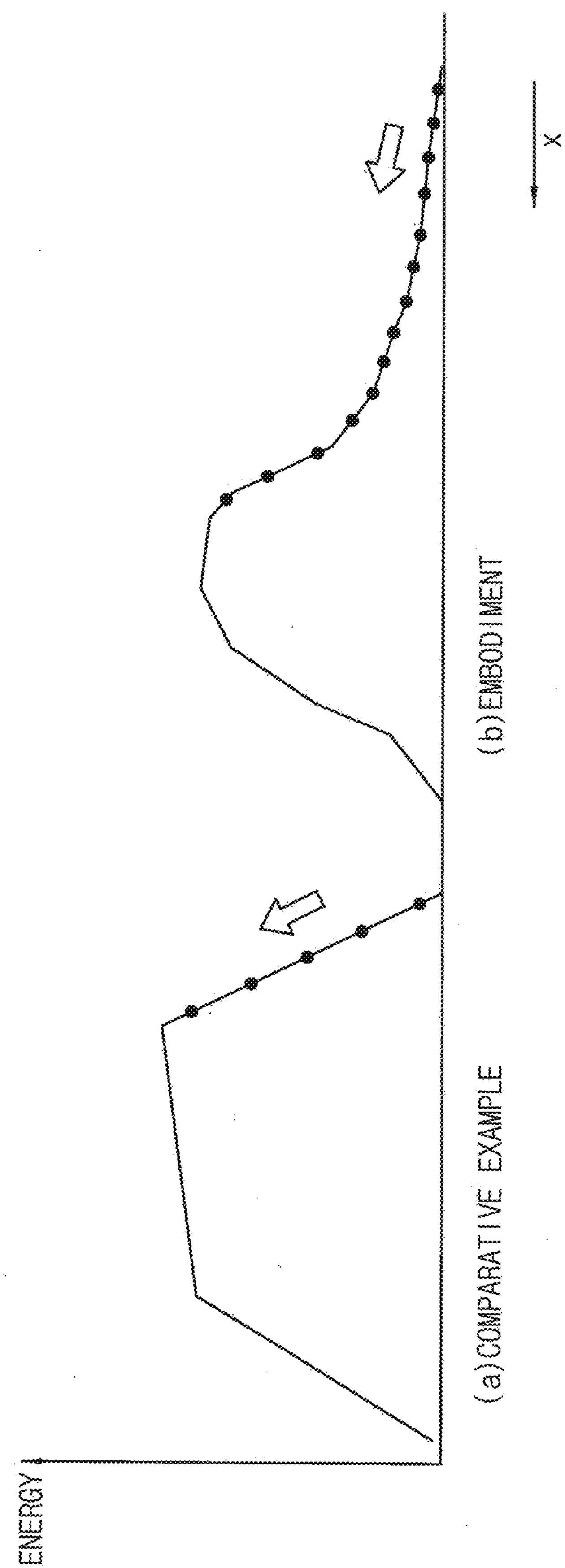
FIG. 3 is a graph showing an energy profile of a laser beam in a short side direction according to a comparative example and showing an energy profile of a laser beam in a short side direction according to an embodiment.

FIG. 3 is a graph showing laser beam energy profiles in a laser beam short side direction according to a comparative example and according to an embodiment.

Referring to FIGS. 2 and 3, regarding a laser crystallizing apparatus (without an optical module OP) according to the comparative example (a), the energy profile in the short side direction of the laser beam has a substantially steep slope at a front 20% of the laser beam in the first direction (x).

Regarding a laser crystallizing apparatus (with an optical module OP) according to an embodiment (b), the energy profile in the short side direction of the laser beam has a substantially gentle/gradual slope at a front 20% of the laser beam in the first direction (x). This is because the energy profile of the laser beam in the short side direction of the laser beam is changed by the optical module OP, and the front 20% of the laser beam in the first direction may have an energy of 150 (mJ/cm^2) or less. An energy peak value generated in a front portion of the laser beam in the first direction (x) can be reduced compared to the comparative example.

Figure 4A:
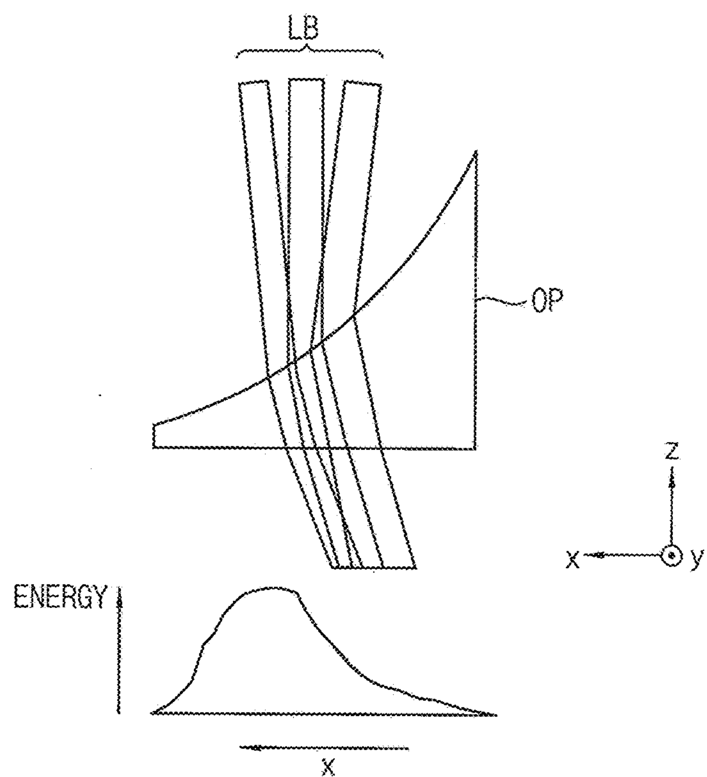
FIG. 4A is a diagram showing a cross-section of an optical module and an energy profile of a laser beam in a short side direction according to an embodiment.
Figure 4B:
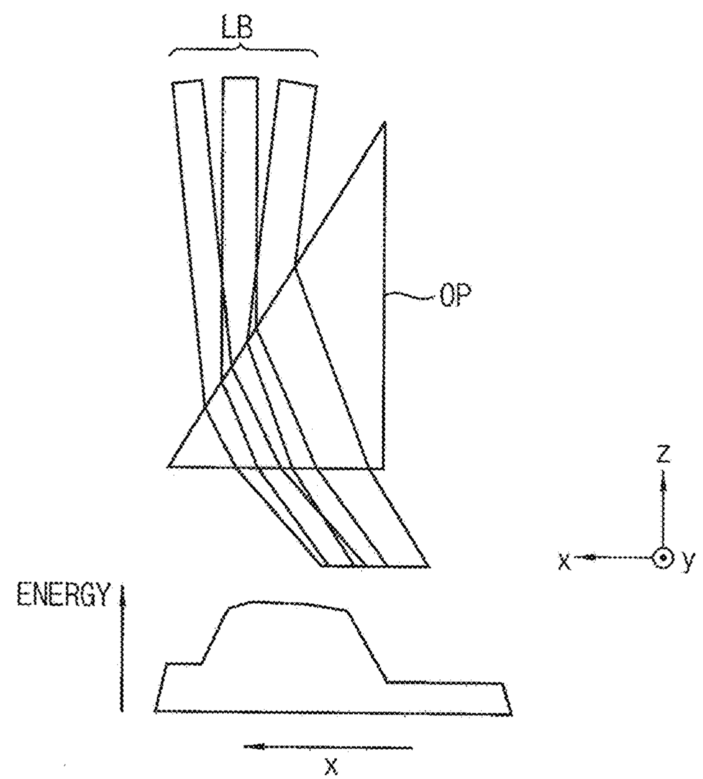
FIG. 4B is a diagram showing a cross-section of an optical module and an energy profile in a short side of a laser beam side direction according to an embodiment.
Figure 4C:
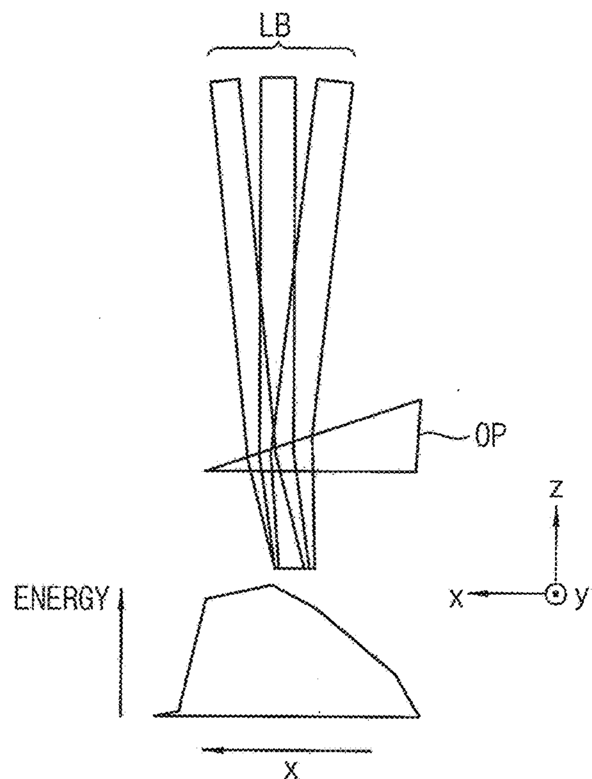
FIG. 4C is a diagram showing a cross-section of an optical module and an energy profile of a laser beam in a short side direction according to an embodiment.

FIGS. 4A to 4C are diagrams showing cross-sections of optical modules and energy profiles in a short side direction of a laser beam according to embodiments.

Referring to FIG. 1 and FIG. 4A, the optical module OP may be/include a concave lens having an upper surface (or input surface) that is concave toward the substrate 10 with respect to an xy plane formed by the first direction (x) and the second direction (y). The lens may extend in the second direction (y), consistent with the lengthwise direction of the projection of the laser beam LB.

Thus, the laser beam LB may pass through the upper surface (or input surface) and then the lower surface (or output surface) of the lens and may diffuse/diverge in a direction opposite to the first direction (x). Thus, a length of the energy profile of the laser beam LB in the first direction (x) may be increased, and the peak value of the energy profile of the laser beam LB may be lowered, in comparison with FIG. 4D, where the optical module OP is not included.

Referring to FIGS. 1, 4B, and 4C, the optical module OP may be/include a lens having an upper surface (or input surface) that is substantially flat and is inclined with respect to the processed surface of the substrate 10 and with respect to the xy plane formed by the first direction (x) and the second direction (y). The lens may extend in the second direction (y), consistent with the lengthwise direction of the projection of the laser beam LB.

An inclination angle of the upper surface with respect to the xy plane may be in a range of 5 to 45 degrees. FIGS. 4B and 4C show different profiles of the laser beam LB corresponding to different inclination angles. In embodiments, a length of the energy profile of the laser beam LB in the first direction (x) can be increased, and a peak value of the energy profile of the laser beam LB can be lowered, in comparison with FIG. 4D, where the optical module OP is not included.

Figure 4D:
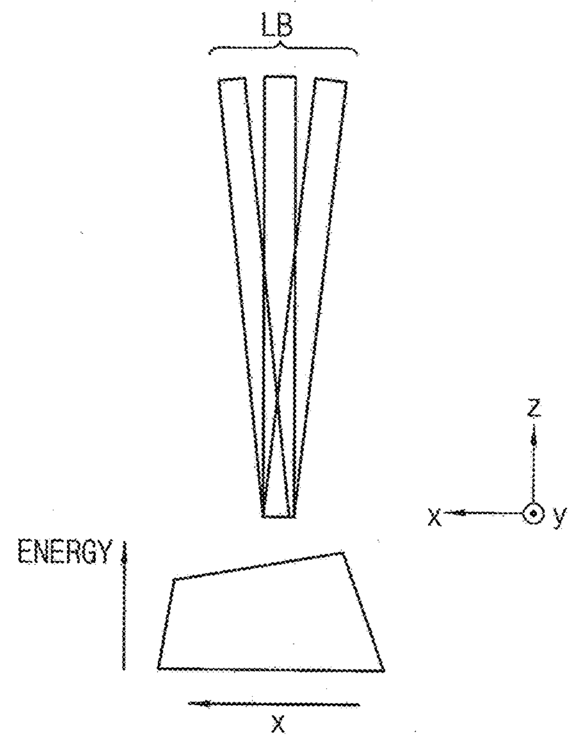
FIG. 4D is a diagram showing an energy profile of a laser beam in a short side direction according to a comparative example.

FIG. 4D is a diagram showing the energy profile in the short side direction of the laser beam according to a comparative example that does not include the optical module.

Referring to FIG. 4D, since the laser beam does not pass through an optical module, the peak value of the energy profile is larger than those illustrated in FIGS. 4A, 4B, and 4C, and the length of the energy profile is the first direction (x) is shorter than those illustrated in FIGS. 4A, 4B, and 4C.

Figure 5A:
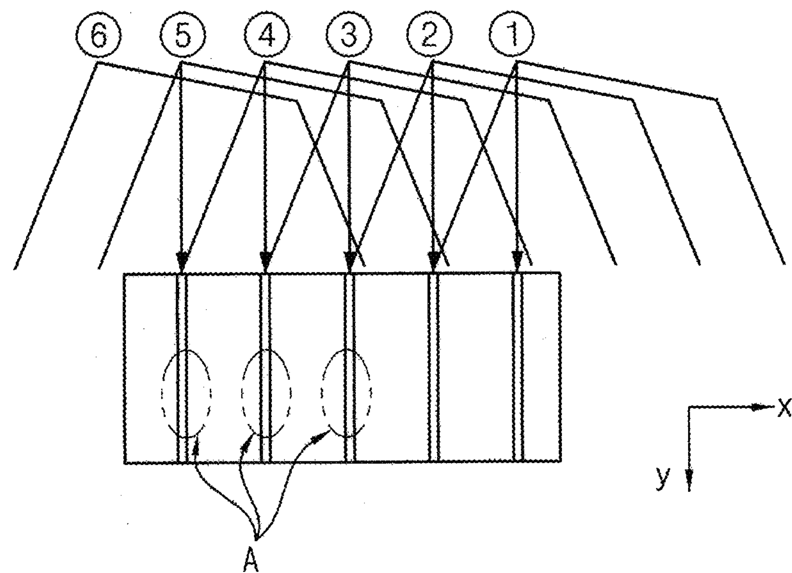
FIG. 5A is a graph showing a relationship between laser energy profiles and a crystallized poly-silicon layer in a process using a laser crystallizing apparatus according to a comparative example.
Figure 5B:
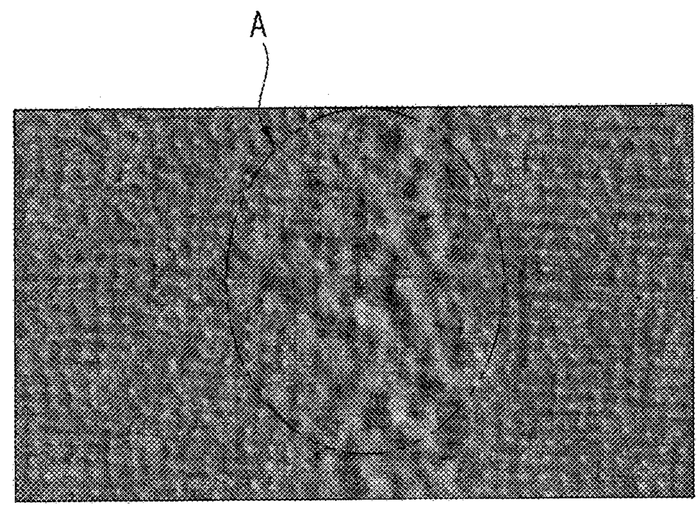
FIG. 5B is a plan view of a region A of FIG. 5A where defects have occurred.
Figure 6:
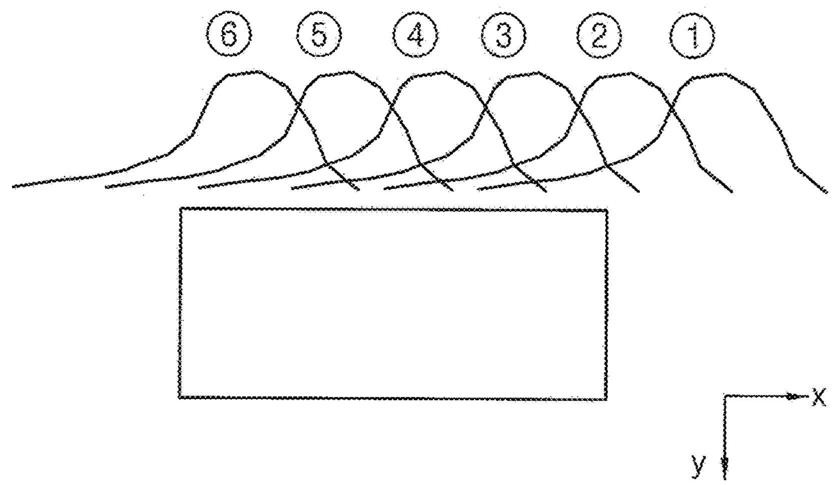
FIG. 6 is a graph showing a relationship between laser energy profiles and a crystallized poly-silicon layer in a process using a laser beam of a laser crystallizing apparatus according to an embodiment.

FIG. 5A is a graph showing a relationship between energy profiles of shots and a crystallized poly-silicon layer in a process using a laser crystallizing apparatus according to a comparative example. FIG. 5B is a plan view of a region A of FIG. 5A where stripe-shape defects have occurred. FIG. 6 is a graph showing a relationship between energy profiles of shots and a crystallized poly-silicon layer in a process using a laser beam of a laser crystallizing apparatus according to an embodiment.

Referring to FIG. 5A, the energy profiles of the shots are shown in an upper part of the figure, and an upper surface of the processed poly-silicon layer on a base substrate is shown in a lower part of the figure.

The shots may be performed in the order of 1, 2, 3, 4, 5, and 6 indicated in the drawing for crystalizing the amorphous silicon layer on the base substrate to form a poly-silicon layer. FIG. 5B shows an enlarged view of the stripe-shape defects (i.e., the region A) that are formed in the poly-silicon layer at positions corresponding to the energy peaks of the shots.

The amorphous silicon layer may contain hydrogen caused by a chemical vapor deposition process used for forming the amorphous silicon layer. Without sufficient dehydrogenation before the amorphous silicon layer is treated by laser shots, when high laser energy is provided in regions of high hydrogen concentration in the amorphous silicon layer, damage due to hydrogen explosion occurs, and defects (line stains) of the poly-silicon layer are formed. In order to prevent such defects, dehydrogenation treatment may be performed on the amorphous silicon layer through a separate high temperature heat treatment process before crystallizing the amorphous silicon layer and after forming the amorphous silicon layer. The hydrogen concentration in the amorphous silicon layer may be 2% or less after sufficient dehydrogenation.

The high temperature heat treatment process for dehydrogenation may include treating the amorphous silicon layer at about 350 Celsius degrees or more for about 480 seconds or more for reducing the hydrogen content in the amorphous silicon layer to 2% or less.

Referring to FIG. 6, energy profiles of shots using a laser crystallizing apparatus according to an embodiment are shown in an upper part of the figure, and an upper surface of the processed poly-silicon layer on a base substrate is shown in the lower part of the figure.

The shots may be performed in the order of 1, 2, 3, 4, 5, and 6 indicated in the drawing for crystallizing the amorphous silicon layer on the base substrate to form a poly-silicon layer.

According to an embodiment, a uniform poly-silicon layer may be formed without generating defects (such as line stains) without performing an additional high temperature heat treatment process for dehydrogenation.

The laser beam provided by a laser crystallizing apparatus according to a comparative example has a steep energy profile slope in the short side and may not desirably irradiate with a gentle energy to obtain a dehydrogenation effect in an amorphous silicon layer. According to embodiments, an optical module to the laser crystallizing apparatus may desirably control the energy profile of the laser beam to achieve dehydrogenation of an amorphous silicon layer; therefore, and a separate heating process for dehydrogenation is not required, so that the process time can be advantageously shortened. Since the poly-silicon layer can be formed without being subjected to the high temperature heat treatment process, potential thermal shock damage to structures under the poly-silicon layer can be prevented.

Figure 7:
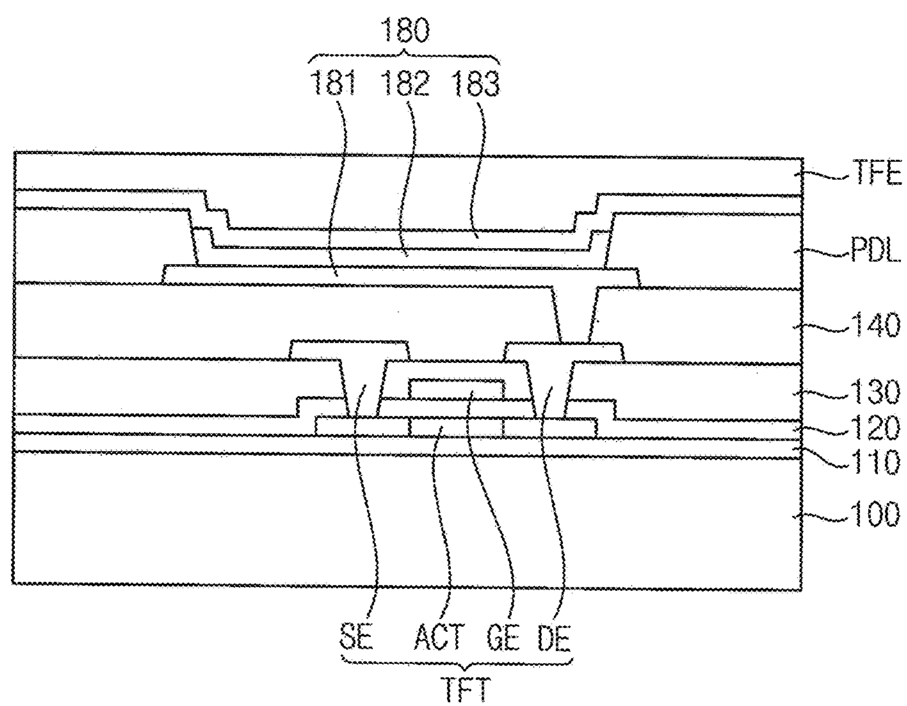
FIG. 7 is a cross-sectional view of a display apparatus manufactured using a method according to an embodiment.

FIG. 7 is a cross-sectional view of a display apparatus manufactured using a method according to an embodiment.

Referring to FIG. 7, the display apparatus may include a base substrate 100, a buffer layer 110, an active pattern ACT (or active/semiconductor member ACT), a first insulating layer 120, a gate electrode GE, a second insulating layer 130, a source electrode SE, a drain electrode DE, a via insulating layer 140, a pixel defining layer PDL, a light emitting structure 180, and a thin film encapsulation layer TFE.

The base substrate 100 may include transparent or opaque insulation materials. For example, the base substrate 100 may include at least one of a quartz substrate, a synthetic quartz substrate, a calcium fluoride substrate, a fluoride-doped quartz substrate, a sodalime glass substrate, a non-alkali glass substrate, etc. The base substrate 100 may be/include a flexible transparent resin substrate, such as a polyimide substrate.

The buffer layer 110 may be disposed on the base substrate 100. The buffer layer 110 may prevent diffusion of metal atoms and/or impurities from the substrate 100 into the active pattern ACT. The buffer layer 110 may control a rate of heat transfer in a crystallization process for forming the active pattern ACT, for obtaining a substantially uniform active pattern ACT. The buffer layer 110 may improve flatness of a surface of the base substrate 100 when the surface of the base substrate 100 is not sufficiently flat.

The active pattern ACT may be disposed on the buffer layer 110. The active pattern ACT may include poly crystal silicon. The active pattern ACT may include drain and source regions doped with an impurity and a channel region between the drain region and the source region. The poly crystal silicon may be formed by depositing and then crystallizing amorphous silicon. A laser crystallizing apparatus and a method according to at least an embodiment can be used for crystallizing the amorphous silicon.

The first insulating layer 120 may cover the active pattern ACT on the buffer layer 110, and may have a substantially uniform thickness along a profile of the active pattern ACT. Alternatively, the first insulating layer 120 may sufficiently cover the active pattern ACT on the buffer layer 110, and may have a substantially flat upper surface without a step around the active pattern ACT. The first insulating layer 120 may include an inorganic insulating material such as a silicon compound or a metal oxide.

A gate pattern including the gate electrode GE may be disposed on the first insulating layer 120. The gate pattern may further include a signal line such as a gate line for transmitting a gate signal for driving the display apparatus. The gate pattern may be formed using a metal, an alloy, a metal nitride, a conductive metal oxide, a transparent conductive material, or the like.

The second insulating layer 130 may be disposed on the first insulating layer 120 and the gate pattern. The second insulating layer 130 may cover the gate pattern on the first insulating layer 120, and may have a substantially uniform thickness along a profile of the gate pattern. Alternatively, the second insulating layer 130 may sufficiently cover the gate pattern on first insulating layer 120, and may have a substantially flat upper surface without forming a step around the gate pattern. The second insulating layer 130 may include an inorganic insulation material such as a silicon compound or a metal oxide.

A data pattern including the source electrode SE and the drain electrode DE may be disposed on the second insulating layer 130. The data pattern may further include a signal line such as a data line for transmitting a data signal for driving the display apparatus. The data pattern may be formed using a metal, an alloy, a metal nitride, a conductive metal oxide, a transparent conductive material, or the like.

The active pattern ACT, the gate electrode GE, the source electrode SE, and the drain electrode DE may be included in a thin film transistor TFT.

The via insulating layer 140 may be disposed on the second insulating layer 130 and on the data pattern is disposed. The via insulating layer 140 may have a single-layer structure, but may have a multi-layer structure including at least two insulating layers. The via insulating layer 140 may be formed using an organic material such as a photoresist, an acrylic resin, a polyimide resin, a polyamide resin, or a siloxane-based resin.

The light emitting structure 180 may include a first electrode 181, an emission layer 182 and a second electrode 183.

The first electrode 181 may be disposed on the via insulating layer 140. The first electrode 181 may include a reflective material or a transmissive material in accordance with the emission type of the display apparatus. The first electrode 181 may have a single layer structure or a multi-layer structure, which may include a metal film, an alloy film, a metal nitride film, a conductive metal oxide film and/or a transparent conductive film.

The pixel defining layer PDL may be disposed on the via insulating layer 140 and may cover edges of the first electrode 181. The pixel defining layer PDL may be formed of an organic material. For example, the pixel defining layer PDL may include at least one of photoresist, acryl-based resin, polyimide-based resin, polyamide-based resin, siloxane-based resin, etc. An opening which exposes the first electrode 181 may be formed by etching the pixel defining layer PDL. An emitting area of the display apparatus may be defined by the opening of the pixel defining layer PDL. A non-emitting area may be adjacent to the opening of the pixel defining layer PDL.

The light emitting layer 182 may be disposed on the first electrode 181 and inside the opening of the pixel defining layer PDL. The light emitting layer 182 may extend on a sidewall of the opening of the pixel defining layer PDL. The light emitting layer 182 may include an organic light emitting layer (EL), a hole injection layer (HIL), a hole transfer layer (HTL), an electron transfer layer (ETL), an electron injection layer (EIL), etc. The hole injection layer, the hole transport layer, the electron transport layer, and the electron injection layer may span a plurality of pixels. The display apparatus may include organic light emitting layers formed of light emitting materials for generating light of different colors, such as a red, a green light, and a blue light. The organic light emitting layer of the of the light emitting layer 182 may include stacked light emitting materials (e.g., materials for generating a red light, a green light and a blue light) to emit a white light. Elements of the light emitting layer 182 may be identical for a plurality of pixels, and pixels can be distinguished by respective color filter layers.

The second electrode 183 may be disposed on the pixel defining layer PDL and the light emitting layer 182. The second electrode 183 may include a transmissive material or a reflective material in accordance with the emission type of the display device. The second electrode 183 may have a single layer structure or a multilayer structure, which may include a metal film, an alloy film, a metal nitride film, a conductive metal oxide film and/or a transparent conductive film.

The thin film encapsulation layer TFE may be disposed on the second electrode 183. The thin film encapsulation layer TFE may prevent penetration of moisture and oxygen from outside. The thin film encapsulation layer TFE may include at least one organic layer and at least one inorganic layer. The at least one organic layer and the at least one inorganic layer may be alternately stacked. For example, the thin film encapsulation layer TFE may include two inorganic layers and one intervening organic layer. A sealing substrate may be provided instead of the thin film encapsulation layer TFE.

According to embodiments, a high quality poly-silicon active pattern can be formed without a separate heat treatment process for dehydrogenation.

Figure 8:
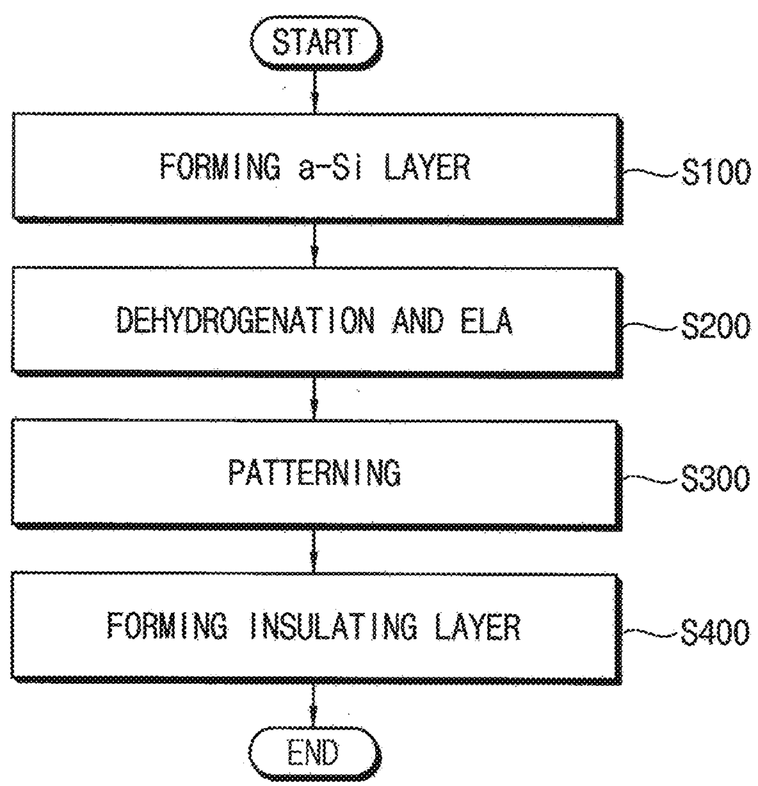
FIG. 8 is a flowchart illustrating a method of manufacturing a display apparatus according to an embodiment.

FIG. 8 is a flowchart illustrating a method of manufacturing a display apparatus according to an embodiment.

Referring to FIG. 8, the method include a step for forming an a-Si (amorphous silicon) layer (S100), a step for dehydrogenation and ELA (S200), a step for patterning (S300), and a step for forming an insulating layer (S400).

In the step for forming an a-Si (amorphous silicon) layer (S100), an amorphous silicon layer may be formed on a base substrate. The base substrate may include a transparent polyimide layer.

In the step for dehydrogenation and ELA (S200), a laser beam may be irradiated to the amorphous silicon layer using the laser crystallizing apparatus according to one or more embodiments. The laser beam is a line laser beam, and front 20% of the line laser beam in a short side has an energy density of 150 mJ/cm^2 or less. Under sufficiently gentle heat, the hydrogen concentration in the amorphous silicon layer is lowered, crystallization can proceed, and a poly-silicon layer can be formed. An energy profile of the laser beam has a sufficiently low peak value, and a slope at the front 20% of the line laser beam is gentle, so that it is possible to prevent defects potentially caused by hydrogen explosion.

A separate heat treatment process may not be performed between the step for forming a-Si layer (S100) and the step for dehydrogenation and ELA (S200).

A hydrogen concentration in the amorphous silicon layer immediately before the step for dehydrogenation and ELA (S200) may be 2 at % or more, and the hydrogen concentration in the poly-silicon layer immediately after the step for dehydrogenation and ELA (S200) may be not more than 2 at %.

In the step for patterning (S300), the poly-silicon layer may be patterned to form an active pattern. In the insulating layer forming step S400, an insulating layer may be formed on the active pattern.

Subsequently, a gate electrode, a second insulating layer, a source electrode, a drain electrode, a via insulating layer, a first electrode, a pixel defining layer, a light emitting layer, a second electrode, and a thin film encapsulation layer may be sequentially formed on the insulating layer Therefore, the display apparatus may be manufactured.

All the steps of the method of manufacturing the display apparatus may be performed at a temperature of 350 Celsius degrees or less, and thus elements of the display apparatus can be prevented from damage due to thermal shock during the manufacturing process.

The embodiments can be applied to organic light emitting display devices and various electronic devices. For example, embodiments can be applied to a mobile phone, a smart phone, a video phone, a smart pad, a smart watch, a tablet PC, a car navigation system, a television, a computer monitor, a notebook, and the like.

The foregoing is illustrative and is not to be construed as limiting. Although example embodiments have been described, many modifications are possible. All such modifications are included within the scope defined in the claims. In the claims, means-plus-function clauses are intended to cover the structures described herein as performing the recited function and not only structural equivalents but also equivalent structures.

What is claimed is:

1. A laser crystallizing apparatus, comprising:

a laser light source configured to generate a laser beam;

an optical system for converting the laser beam into a line laser beam;

an optical module configured to disperse energy of the line laser beam in a first direction for generating a dispersed line laser beam, wherein the first direction is perpendicular to a lengthwise direction of the optical module, wherein a first end of the optical module is opposite a second end of the optical module in the first direction; and a mechanism for moving a substrate in the first direction relative to the optical module for the first end of the optical module to overlap the substrate before the second end of the optical module overlaps the substrate, wherein energy density of a 20% section of the dispersed line laser beam in the first direction is 150 mJ/cm^2 or less, and wherein the first end of the optical module overlaps the 20% section of the dispersed line laser beam.

2. The laser crystallizing apparatus of claim 1, wherein the optical module comprises an input face for receiving the line laser beam and comprises an output face for outputting the dispersed line laser beam, and wherein the input face is inclined with respect to the output face.

3. The laser crystallizing apparatus of claim 2, wherein an angle between the input face and the output face is in a range of 5 degrees to 45 degrees.

4. The laser crystallizing apparatus of claim 1, wherein the optical module is a concave lens having a concave input surface for receiving the line laser beam.

5. The laser crystallizing apparatus of claim 1, wherein the optical system comprises:

a homogenizer for redistributing energy of the laser beam to generate a redistributed laser beam; and a P-lens for converting the redistributed laser beam into the line laser beam.

6. The laser crystallizing apparatus of claim 1, further comprising the substrate, wherein the substrate is for supporting an amorphous silicon layer.

7. The laser crystallizing apparatus of claim 6, wherein the optical module is configured to project the dispersed line laser beam onto the amorphous silicon layer for changing the amorphous silicon layer into a poly-silicon layer, and wherein a hydrogen concentration of the amorphous silicon layer is 2 at % or more.

8. The laser crystallizing apparatus of claim 7, wherein a hydrogen concentration of the poly-silicon layer is 2 at % or less.

9. A method of manufacturing a display apparatus, the method comprising:

forming an amorphous silicon layer on a base substrate;

forming a poly-silicon layer by projecting instances of a dispersed line laser beam onto the amorphous silicon layer for crystallizing and dehydrogenating the amorphous silicon layer;

forming a semiconductor member by patterning the poly-silicon layer; and forming an insulating layer on the semiconductor member, wherein energy density of a 20% section of the dispersed line laser beam in a first direction is 150 mJ/cm^2 or less, and wherein the 20% section of the dispersed line laser beam overlaps the amorphous silicon layer before a remainder section of the dispersed line laser beam as the base substrate is moved in the first direction.

10. The method of claim 9, further comprising using a laser crystallizing apparatus to provide the dispersed line laser beam, wherein the laser crystallizing apparatus comprises:

a laser light source configured to generate a laser beam;

an optical system for converting the laser beam into a line laser beam; and an optical module configured to disperse energy of the line laser beam in the first direction for generating the line laser beam, wherein the first direction is perpendicular to a lengthwise direction of the optical module.

11. The method of claim 9, wherein the amorphous silicon layer is formed through a chemical vapor deposition process.

12. The method of claim 11, wherein no heat treatment is performed on the amorphous silicon layer before any instance of the dispersed line laser beam is projected onto the amorphous silicon layer.

13. The method of claim 9, wherein immediately before the dispersed line laser beam is projected onto the amorphous silicon layer, a hydrogen concentration in the amorphous silicon layer is 2 at % or more.

14. The method of claim 13, wherein a hydrogen concentration in the poly-silicon layer immediately after forming the poly-silicon layer is 2 at % or less.

15. The method of claim 9, wherein the base substrate comprises a transparent polyimide layer.

16. The method of claim 9, wherein each of the amorphous silicon layer, the poly-silicon layer, the semiconductor member, and the insulating layer is formed below 350 Celsius degrees.

17. The method of claim 9, further comprising:

forming source and drain electrodes on the insulating layer;

forming a first electrode on the source and drain electrodes;

forming a light emitting layer on the first electrode; and forming a second electrode on the light emitting layer.

18. A laser crystallizing apparatus, comprising:

a laser light source configured to generate a laser beam;

a lens set for converting the laser beam into a line laser beam; and an optical module configured to change an energy profile of the line laser beam in a first direction to form an output laser beam, wherein the first direction is perpendicular to a lengthwise direction of the optical module, wherein energy density of a 20% section of the output laser beam in the first direction is 150 mJ /cm^2 or less, and wherein the 20% section of the output laser beam overlaps a target substrate before a remainder section of the dispersed line laser beam as the target substrate is moved in the first direction.

* * * * *